(12) United States Patent
Saida et al.

(10) Patent No.: US 8,064,033 B2
(45) Date of Patent: Nov. 22, 2011

(54) DISPLAY AND PROCESS FOR PRODUCING THE SAME

(75) Inventors: Shinsuke Saida, Tenri (JP); Hirohiko Nishiki, Kashiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 234 days.

(21) Appl. No.: 12/303,769

(22) PCT Filed: Feb. 6, 2007

(86) PCT No.: PCT/JP2007/051996
§ 371 (c)(1),
(2), (4) Date: Dec. 8, 2008

(87) PCT Pub. No.: WO2007/144995
PCT Pub. Date: Dec. 21, 2007

(65) Prior Publication Data
US 2010/0231840 A1   Sep. 16, 2010

(30) Foreign Application Priority Data

Jun. 15, 2006   (JP) .................................. 2006-166468

(51) Int. Cl.
G02F 1/1333   (2006.01)
G02F 1/1339   (2006.01)

(52) U.S. Cl. ........................................ 349/158; 349/153

(58) Field of Classification Search .......... 349/153–154, 349/158–160, 190
See application file for complete search history.

(56) References Cited

U.S. PATENT DOCUMENTS

| | | |
|---|---|---|
| 6,344,888 B2 | 2/2002 | Yasukawa |
| 6,933,996 B2 | 8/2005 | Yasukawa |
| 7,158,205 B2 | 1/2007 | Yasukawa |
| 7,184,105 B2 | 2/2007 | Yasukawa |
| 7,324,171 B2 | 1/2008 | Yasukawa |
| 2001/0046011 A1* | 11/2001 | Yasukawa ..................... 349/113 |
| 2005/0140861 A1 | 6/2005 | Saida et al. |
| 2008/0088751 A1 | 4/2008 | Yasukawa |

FOREIGN PATENT DOCUMENTS

| | | |
|---|---|---|
| EP | 0 838 714 A2 | 4/1998 |
| JP | 03-055516 A | 3/1991 |
| JP | 04-020929 A | 1/1992 |
| JP | 11-002812 A | 1/1999 |
| JP | 11-064891 A | 3/1999 |
| JP | 2003-215607 A | 7/2003 |
| JP | 2005-019082 A | 1/2005 |
| WO | WO 2007/144995 | * 12/2007 |

OTHER PUBLICATIONS

Official Communication issued in International Patent Application No. PCT/JP2007/051996, mailed on May 22, 2007.

Official Communication issued in corresponding European Patent Application No. 07713838.6, mailed on Feb. 8, 2011.

* cited by examiner

Primary Examiner — Dung T. Nguyen

(74) Attorney, Agent, or Firm — Keating & Bennett, LLP

(57) ABSTRACT

A display device includes a first substrate, a second substrate arranged to face the first substrate, and a seal member arranged to bond the first substrate and the second substrate to each other with a display medium layer enclosed between the first substrate and the second substrate. At least one of the first substrate and the second substrate has a layered structure of a reinforcing layer and one or more layers having a lower strength than that of the reinforcing layer, and at least a portion of the seal member is bonded directly to the reinforcing layer.

13 Claims, 5 Drawing Sheets

DISPLAY AND PROCESS FOR PRODUCING THE SAME

BACKGROUND OF THE INVENTION

1. Field of the Invention

The present invention relates to a display device having a substrate defined by a plurality of layers including a reinforcing layer, and a manufacturing method thereof.

2. Description of the Related Art

With recent progress in communication technology, display devices such as a liquid crystal display device capable of driving with low power consumption and a self light-emitting organic EL display device have been developed as display devices for use in, for example, portable information terminal equipment. Reduction in weight and thickness, improvement in shock resistance, and the like have been demanded for display devices accordingly.

In order to respond to this demand, the use of a plastic substrate instead of a commonly used glass substrate has been proposed. However, a plastic substrate made of a sheet of a single resin has various problems as a substrate for display devices.

The most critical problem is that a plastic substrate has a relatively large linear expansion coefficient. In other words, glass generally has a linear expansion coefficient of about several ppm/° C., whereas plastic has a linear expansion coefficient of about several tens of ppm/° C. or higher, which is much higher than the linear expansion coefficient of glass. A substrate having a high linear expansion coefficient significantly varies in its dimensions with the ambient temperature. It is therefore extremely difficult to accurately pattern driving elements such as TFTs (thin film transistors) and the like. It can be considered to use a glass substrate having high dimension stability as a TFT substrate and to use a plastic substrate only as a counter substrate. In this case, however, it is difficult to accurately align a CF (color filter) formed on the counter substrate with pixel electrodes on the TFT substrate.

In order to achieve a reduced linear expansion coefficient and improved dimensional stability of a plastic substrate, it has been proposed to form a reinforcing layer containing a filler in a resin of a plastic substrate so that the resultant substrate becomes a composite material substrate as a whole. For example, a plastic substrate having a high heat resistance and a high rigidity can be obtained by including a fibrous material in the reinforcing layer (e.g., see Japanese Laid-Open Patent Publication No. H11-2812). Especially when the plastic substrate is a transparent substrate, it is preferable to use transparent fibers such as a glass cloth as the fibrous material.

On the other hand, a liquid crystal display device, for example, has a TFT substrate and a counter substrate which are laminated to each other through a frame-shaped seal member. Inside the seal member is enclosed a liquid crystal layer between the TFT substrate and the counter substrate. If a part of the seal member peels off from the substrate, a liquid crystal material flows out or a foreign matter enters the liquid crystal layer, degrading display quality.

In order to improve the adhesive power of a seal member to a substrate, it is known to form a substrate having a concave-convex surface in a seal-material formation region (e.g., see Japanese Laid-Open Patent Publication No. H04-20929). It is also known to form a substrate having a rough surface (e.g., see Japanese Laid-Open Patent Publication No. H03-55516). These methods aim to improve the contact power of the seal member by increasing the contact area between the substrate surface and the seal member.

In the case where a reinforcing layer containing a fibrous material is formed in a plastic substrate as described above, the reinforcing layer has a concave-convex surface corresponding to the concave-convex shape of the fibers. In order to improve smoothness of the surface of the reinforcing layer, it is necessary to further form a resin layer as a smoothness improving layer. Moreover, since it is generally extremely difficult to assign a function to reduce moisture permeability, oxygen permeability, and the like to a single resin, it is also necessary to separately provide an inorganic barrier layer for preventing moisture permeation and the like. As a result, the substrate having the reinforcing layer has a layered structure of a plurality of resin layers.

In the case where a plastic substrate has such a layered structure, however, the adhesion power between resin layers varies depending on the layers, whereby film peeling is likely to occur at an interface of the layers. This problem is particularly significant in a seal-member formation region which is likely to be subjected to an external force. In other words, in a display device having a substrate with such a layered structure, not only a seal member may peel off from the substrate, but film peeling is likely to occur in the substrate itself in the sealing-member formation region.

For example, in the case where the adhesion power between the seal member and the substrate surface is stronger than that between the layers at the interface, film peeling may occur at the interface of the layers rather than the seal member peeling off from the substrate. Moreover, in a baking process that is performed after the substrates are laminated to each other, film peeling may occur at the interface of the layers in the seal-member formation region due to the difference in expansion (thermal shrinkage) between the TFT substrate and the counter substrate.

SUMMARY OF THE INVENTION

In view of the above problems, preferred embodiments of the present invention improve the adhesion power between a substrate and a seal member, and prevent film peeling of a substrate itself.

In a preferred embodiment, a seal member is adhered directly to a reinforcing layer of a substrate in the present invention.

More specifically, a display device according to a preferred embodiment of the present invention includes a first substrate, a second substrate facing the first substrate, and a seal member arranged to bond the first substrate and the second substrate to each other with a display medium layer enclosed between the first substrate and the second substrate. At least one of the first substrate and the second substrate has a layered structure of a reinforcing layer and one or more layers having a lower strength than that of the reinforcing layer, and at least a portion of the seal member is bonded directly to the reinforcing layer.

Preferably, an opening is formed in the one or more layers so as to expose a portion of the reinforcing layer, and the seal member is bonded to the reinforcing layer in the opening.

The seal member may have an approximately frame shape when viewed from a normal direction to the first substrate or the second substrate, and the opening may have a ring shape extending along a circumferential direction of the seal member.

Preferably, a plurality of ring-shaped openings are coaxially arranged.

The seal member may have an approximately frame shape when viewed from a normal direction to the first substrate or the second substrate, and the opening may be provided in a staggered pattern when viewed from the normal direction to the first substrate or the second substrate.

The seal member may have an approximately rectangular frame shape when viewed from a normal direction to the first substrate or the second substrate, and the opening may be formed in four corner regions of the seal member when viewed from the normal direction to the first substrate or the second substrate.

The opening may extend through the reinforcing layer.

Of the first substrate and the second substrate, a substrate having the reinforcing layer is preferably a flexible substrate.

Preferably, the reinforcing layer is a layer made of a collection of fiber bodies.

Preferably, the fiber bodies are made of glass fibers.

The fiber bodies may be made of aromatic polyamide resin fibers, for example.

Preferably, each of the first substrate and the second substrate has the reinforcing layer.

Desirably, the reinforcing layer has a smaller linear thermal expansion coefficient than that of the one or more layers.

The display medium layer may be a liquid crystal layer.

A method for manufacturing a display device according to another preferred embodiment of the present invention is a method for manufacturing a display device including a seal member for bonding a first substrate and a second substrate arranged to face the first substrate to each other with a display medium layer enclosed between the first substrate and the second substrate, wherein at least one of the first substrate and the second substrate has a layered structure of a reinforcing layer and one or more layers having a lower strength than that of the reinforcing layer. The method includes the steps of: forming an opening in at least one of the first substrate and the second substrate having the layered structure so that the reinforcing layer is exposed; supplying the seal member to the first substrate or the second substrate to bond the seal member directly to the reinforcing layer in the opening; and laminating the first substrate and the second substrate to each other through the seal member.

In the seal member supplying step, the seal member may be formed in an approximately frame shape when viewed from a normal direction to the first substrate or the second substrate, and in the opening forming step, the opening may be formed in a ring shape extending along a circumferential direction of an approximately frame-shaped region where the seal member is formed.

Preferably, a plurality of ring-shaped openings are coaxially arranged.

In the seal member supplying step, the seal member may be formed in an approximately frame shape when viewed from a normal direction to the first substrate or the second substrate, and in the opening forming step, the opening may be provided in a staggered pattern when viewed from the normal direction to the first substrate or the second substrate.

In the seal member supplying step, the seal member may be formed in an approximately rectangular frame shape when viewed from a normal direction to the first substrate or the second substrate, and in the opening forming step, the opening may be formed in four corner regions of a region where the seal member is formed, when viewed from the normal direction to the first substrate or the second substrate.

The opening may be formed so as to extend through the reinforcing layer.

Of the first substrate and the second substrate, a substrate having the reinforcing layer is preferably a flexible substrate.

Preferably, the reinforcing layer is a layer made of a collection of fiber bodies. Preferably, the fiber bodies are made of glass fibers. The fiber bodies may be made of aromatic polyamide resin fibers.

Preferably, each of the first substrate and the second substrate has the reinforcing layer.

Desirably, the reinforcing layer has a smaller linear thermal expansion coefficient than that of the one or more layers.

The display medium layer may preferably be a liquid crystal layer, for example.

In various preferred embodiments of the present invention, a first substrate and a second substrate are bonded to each other by a seal member and laminated to each other. A display medium layer is enclosed between the first substrate and the second substrate by the seal member. The seal member is formed in, for example, an approximately rectangular frame shape when viewed from a normal direction to the first substrate or the second substrate. At least one of the first substrate and the second substrate has a layered structure of a reinforcing layer and one or more layers having a lower strength than that of the reinforcing layer. In other words, the reinforcing layer has a higher strength than that of the other layers of the layered structure.

At least a portion of the seal member is bonded directly to the reinforcing layer rather than to the one or more layers. Preferably, an opening is formed in the one or more layers so as to expose a portion of the reinforcing layer and the seal member is bonded to the reinforcing layer in the opening. This structure enables the seal member to be bonded in direct contact with the reinforcing layer even when the reinforcing layer is covered by the other layers.

The seal member is thus bonded to the reinforcing member having a higher strength rather than to the one or more layers having a relatively low strength. As a result, even when the first substrate or the second substrate has a layered structure, the adhesion power between the first substrate or the second substrate and the seal member can be increased.

When the seal member is bonded directly to the reinforcing layer in a seal-member formation region that is likely to be intensively subjected to an external force, no layered portion of other layers is present between the seal member and the reinforcing layer. As a result, film peeling of the substrate itself can be prevented.

The opening may be formed in a ring shape extending along a circumferential direction of the seal member when viewed from a normal direction to the first substrate or the second substrate. The opening may alternatively be arranged in a staggered pattern. With this arrangement, wirings or the like can be extended from a region surrounded by the seal member to a region outside the seal member.

The first substrate or the second substrate having the reinforcing layer can be a flexible substrate as a whole when the one or more layers are made of, for example, a resin. Although film peeling of the substrate is a very critical problem in the case of a flexible substrate, this problem is avoided by preferred embodiments of the present invention.

By using the reinforcing layer made of a collection of fiber bodies, the surface area of the reinforcing layer is increased and the adhesion power with the seal member is increased. Moreover, by using the reinforcing layer made of, for example, glass fibers or aromatic polyamide resin fibers, the strength of the reinforcing layer is easily increased, and the linear thermal expansion coefficient of the reinforcing layer is reduced. Reduction in linear thermal expansion coefficient enables elements to be accurately patterned on the substrate.

For example, by using a low linear expansion coefficient material (for example, glass fibers) as a material of the reinforcing layer, deformation of the substrate in a heating process is prevented, whereby accurate patterning of elements can be implemented. Moreover, by using the reinforcing layer made of a collection of fiber bodies, deformation of the substrate is prevented and the surface area of the reinforcing layer is increased, whereby the adhesion power between the reinforcing layer and the seal member through the opening is increased.

According to various preferred embodiments of the present invention, the seal member is adhered directly to the reinforcing layer of the substrate. Therefore, the adhesion power between the substrate and the seal member is greatly improved as well as film peeling in the substrate itself can be prevented. As a result, the lamination strength between the first substrate and the second substrate can be improved.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Hereinafter, preferred embodiments of the present invention will be described in detail with reference to the accompanying drawings. Note that the present invention is not limited to the following preferred embodiments.

First Preferred Embodiment

Figure 1:
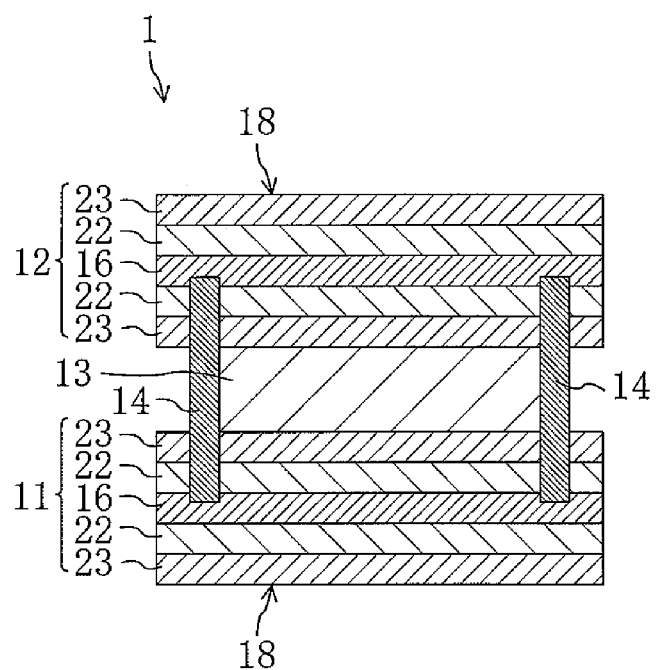
FIG. 1 is a cross-sectional view schematically showing a structure of a liquid crystal display device according to a preferred embodiment of the present invention.

FIGS. 1 through 5 show a first preferred embodiment of the present invention. In the first preferred embodiment, a transmissive liquid crystal display device 1 will be described as an example of a display device. FIG. 1 is a cross-sectional view showing a schematic structure of the liquid crystal display device 1.

As shown in FIG. 1, the liquid crystal display device 1 includes a TFT substrate 11 as a first substrate and a counter substrate 12 as a second substrate disposed so as to face the TFT substrate 11. The liquid crystal display device 1 further includes a seal member 14 arranged to bond the TFT substrate 11 and the counter substrate 12 to each other with a liquid crystal layer 13 enclosed as a display medium layer between the TFT substrate 11 and the counter substrate 12. Note that, in the following description, the TFT substrate 11 and the counter substrate 12 are sometimes simply referred to as substrates 11, 12.

Although not shown in the figure, a backlight unit is provided as a light source on the opposite side to the liquid crystal layer 13 on the TFT substrate 11. Light emitted from the backlight unit into the liquid crystal layer through the TFT substrate 11 is selectively transmitted and modulated to provide desired display.

Although not shown in the figure, a color filter, a common electrode, a black matrix and the like are formed on the counter substrate 12.

The TFT substrate 11, on the other hand, is formed as a so-called active matrix substrate. Although not shown in the figure, a plurality of pixels are arranged in a matrix pattern on the TFT substrate 11. In other words, a plurality of wirings comprised of gate lines and source lines are patterned in a grid-like manner on the TFT substrate 11. Each pixel is thus defined by a rectangular region defined by a gate line and a source line. A pixel electrode for driving the liquid crystal layer is formed in each pixel. For example, the pixel electrode is provided approximately in the middle of the pixel and has a rectangular shape.

A TFT (thin film transistor) is provided in each pixel as a switching element for switching a corresponding pixel electrode. Although not shown in the figure, each TFT includes a gate electrode connected to a gate line, a source electrode connected to a source line, and a drain electrode connected to a pixel electrode. With a scanning voltage being applied to the gate electrode through the gate line, a signal voltage is supplied from the source line to the pixel electrode through the source electrode and the drain electrode.

Although not shown in the figure, the TFT substrate 11 has a display region that has the pixels formed therein and contributes to display and a frame region (non-display region) that surrounds the display region and does not contribute to display. A drive circuit (not shown) for driving the pixels is provided in the frame region.

Each of the TFT substrate 11 and the counter substrate 12 preferably is a composite layer formed by a plurality of layers and is a substrate that is flexible as a whole. In other words, each of the TFT substrate 11 and the counter substrate 12 is a transparent composite plastic substrate. As shown in the cross-sectional view of FIG. 2, each of the TFT substrate 11 and the counter substrate 12 preferably has a layered structure 18 of a reinforcing layer 16 and one or more layers 17 (hereinafter, sometimes simply referred to as other layers 17) having a lower strength than that of the reinforcing layer 16. In other words, the reinforcing layer 16 has the highest mechanical strength among the plurality of layers in each of the TFT substrate 11 and the counter substrate 12.

Note that the present invention is not limited to the above structure and at least one of the TFT substrate 11 and the counter substrate 12 need only have the layered structure 18. Of the TFT substrate 11 and the counter substrate 12, only the substrate having the layered structure 18 including the reinforcing layer 16 need be a flexible substrate. Accordingly, one of the TFT substrate 11 and the counter substrate 12 may be a flexible substrate and the other may be another substrate such as a glass substrate.

The reinforcing layer 16 is preferably made of a collection of fiber bodies 19. In other words, as shown in the plan view of FIG. 5, the reinforcing layer 16 is formed by weaving the fiber bodies 19, each made of a bundle of a plurality of fibers, in longitudinal and transverse directions at a predetermined pitch. The fiber bodies 19 are preferably made of, for example, transparent glass fibers.

For example, E-glass, D-glass, S-glass, or the like is used as the fibers of the fiber bodies 19. Each fiber preferably has a diameter of 20 μm or less, and more desirably, about 10 μm or less, for example. Each fiber body 19, on the other hand, desirably has a diameter of about 200 μm or less, for example. The pitch of adjacent fiber bodies 19 is preferably about 100 μm or less, for example.

The smaller the diameters of the fibers and the fiber bodies 19 and the pitch of the fiber bodies 19 are, the more preferable, because the overall mechanical strength of the substrate is increased. Moreover, it is preferable to uniformly arrange the fiber bodies 19 over the substrate.

A common weave such as plain weave, satin weave, and twill weave can be used for a fiber cloth. The reinforcing layer 16 may be formed in a non-woven state by dispersing the fibers. Alternatively, the fibers may be arranged in one direction without being woven. Note that the fiber bodies 19 may be made of aromatic polyamide resin fibers and may be used as a collection of the fiber bodies 19 in the same manner as described above.

Figure 2:
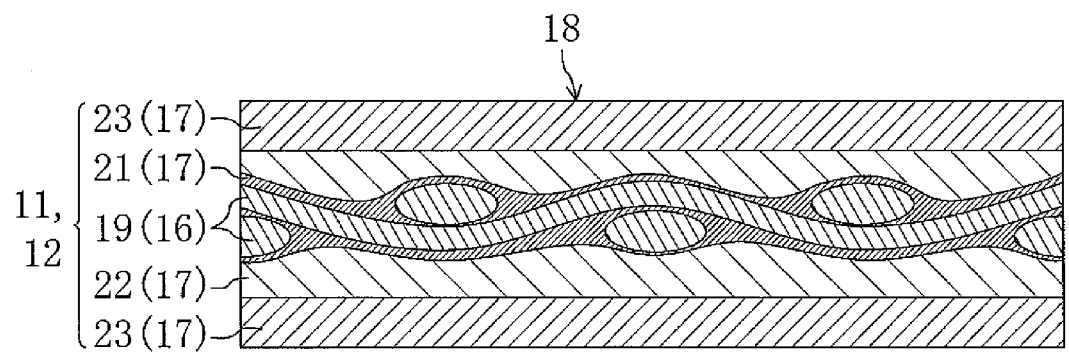
FIG. 2 is an enlarged cross-sectional view of a TFT substrate or a counter substrate.

As shown in FIG. 2, the other layers 17 of the layered structure 18, the layers other than the reinforcing layer 16, include a resin layer 21 that covers the reinforcing layer 16, a planarizing layer 22 that covers the resin layer 21, and a barrier layer 23 that covers the planarizing layer 22.

As shown in FIG. 2, the front and back sides of the reinforcing layer 16 are covered by the resin layer 21. In other words, the reinforcing layer 16 is impregnated with a resin. The fiber bodies 19 of the reinforcing layer 16 are thus fixed by the resin layer 21.

A common transparent resin, an epoxy resin, a mixed resin of a phenol epoxy resin, a mixed resin of a bismaleimide-triazine resin, a polycarbonate, a polyethersulfone, a polyetherimide, or other suitable material may be used as the resin layer 21.

The planarizing layer 22 is formed on the front and back sides of the resin layer 21 in order to planarize the concave-convex surface of the resin layer 21 corresponding to the surface profile of the reinforcing layer 16. The planarizing layer 22 is made of a transparent resin. The same material as that of the resin layer 21 can be used as the planarizing layer 22.

The barrier layer 23 is preferably made of a film of an inorganic material and does not allow foreign matters such as moisture to permeate therethrough. Deformation of the TFT substrate 11 and the counter substrate 12 and entry of foreign matters are prevented by forming the barrier layer 23 on the front and back sides of the planarizing layer 22.

The reinforcing layer 16 thus has a higher mechanical strength and a lower linear thermal expansion coefficient than the other layers 17. Due to the smaller linear expansion coefficient of the reinforcing layer 16, overall expansion of the substrate can be prevented even in a process of forming the TFTs, the color filter, and the like under high temperature conditions, and accurate patterning can be implemented.

Figure 3:
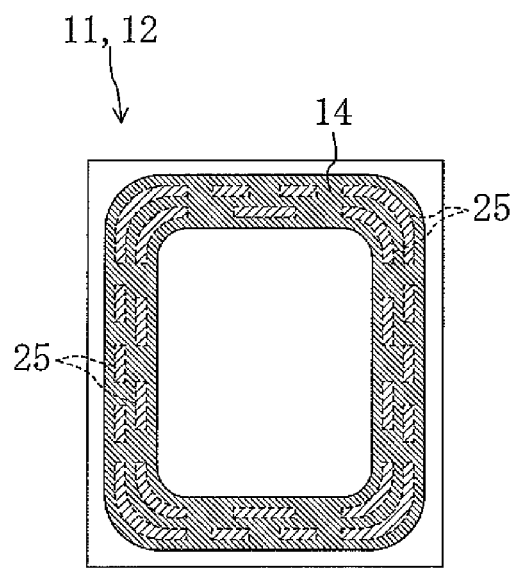
FIG. 3 is a plan view schematically showing a seal member and openings that are formed in a substrate of a first preferred embodiment of the present invention.

As schematically shown in the plan view of FIG. 3, the seal member 14 is formed in an approximately rectangular frame shape on the TFT substrate 11 or the counter substrate 12 when viewed from a normal direction to the TFT substrate 11 or the counter substrate 12. Four corner regions of the seal member 14 preferably have an R shape. A thermosetting resin and a photocurable resin can be used as the seal member 14. Note that the seal member 14 may have an approximately frame shape other than the rectangular shape.

Figure 4:
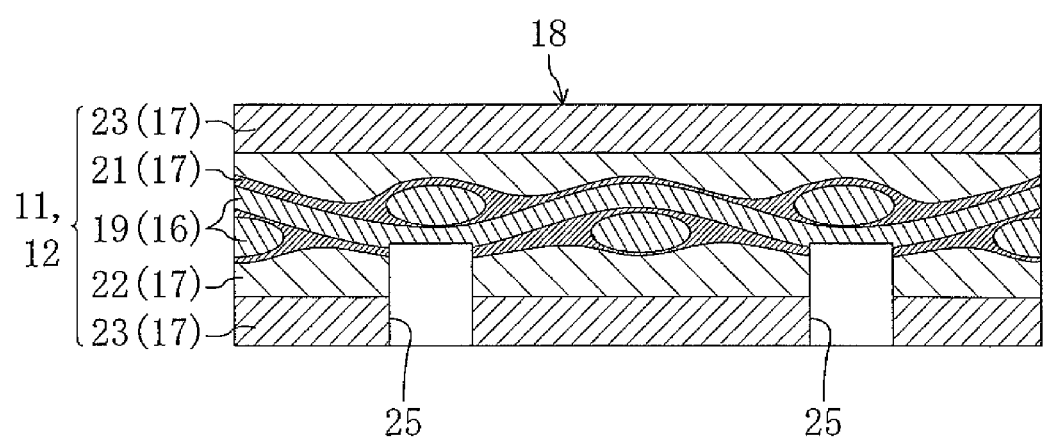
FIG. 4 is an enlarged cross-sectional view of a TFT substrate or a counter substrate having openings formed therein.
Figure 5:
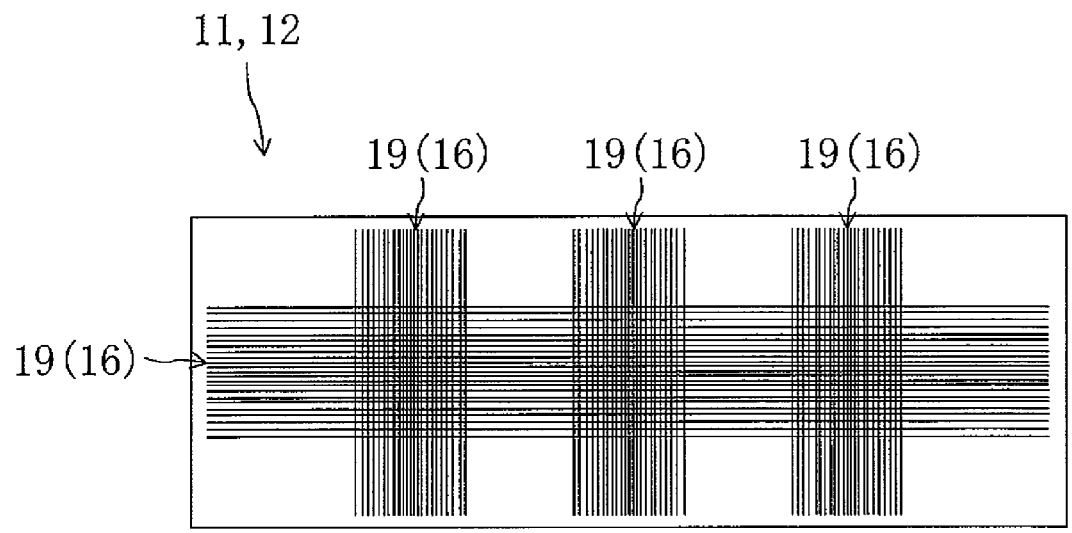
FIG. 5 is a plan view showing a schematic structure of a reinforcing layer.

At least a part of the seal member 14 is bonded directly to the reinforcing layer 16. In other words, as shown in FIG. 3 and FIG. 4 that is a cross-sectional view of the TFT substrate 11 or the counter substrate 12, a plurality of groove-like openings 25 are formed in the other layers 17 of the TFT substrate 11 or the counter substrate 12 so as to expose a portion of the reinforcing layer 16. The reinforcing layer 16 is exposed at the bottom of the openings 25. The openings 25 are formed so as to be open to the liquid crystal layer 13 side. Each opening 25 extends through the resin layer 21, the planarizing layer 22, and the barrier layer 23 which are located on the liquid crystal layer 13 side of the reinforcing layer 16.

The openings 25 are arranged in a staggered pattern (or a mosaic pattern) when viewed from the normal direction to the TFT substrate 11 or the counter substrate 12. Accordingly, a predetermined gap is provided between adjacent openings 25. An opening 25 curved along the seal member 14 is formed in the four corner regions of the seal member 14. These curved openings 14 are longer than the other linear openings 25.

By thus arranging the openings 25 in a staggered or mosaic pattern, wirings can be extended from the display region in the middle of the substrate to the frame region through the gaps between the openings 25. It is also preferable to form a relatively long, continuous opening 25 in a region where the wirings are not extended, because the area of the openings 25 is thus increased and the adhesion power between the seal member 14 and the substrate 11, 12 can be increased as a result.

By filling the openings 25 with the seal member 14, the seal member 14 is bonded to the reinforcing layer 16 in the openings 25 and is bonded to the surface of the barrier layer 23 in a region around the openings 25. The TFT substrate 11 and the counter substrate 12 are thus bonded and laminated to each other by the seal member 14 formed on the surface of the barrier layer 23 and the reinforcing layer 16 in the openings 25. As a result, the adhesion power between the seal member 14 and the TFT substrate 11 and the counter substrate 12 can be increased while preventing permeation of foreign matters such as moisture by the barrier layer 23.

Manufacturing Method

Hereinafter, a manufacturing method of the liquid crystal display device 1 will be described.

The liquid crystal display device 1 is manufactured preferably by performing the step of forming the openings and the step of forming an alignment film after forming the TFT substrate 11 and the counter substrate 12. A laminating step is performed after the step of supplying the seal member.

In the step of forming the TFT substrate 11, TFTs, pixel electrodes, wirings, and the like are patterned on a plastic substrate having the layered structure 18 of the reinforcing layer 16, the resin layer 21, the planarizing layer, and the barrier layer 23. In the step of forming the counter substrate 12, on the other hand, a color filter, a common electrode, a black matrix, and the like are formed on a plastic substrate having the same layered structure 18.

Next, in the step of forming the openings, the openings 25 are formed in a predetermined pattern by performing a surface treatment on the TFT substrate 11 and the counter substrate 12 having the layered structure 18. The openings 25 are formed so as to expose the reinforcing layer 16 by partially removing the resin layer 21, the planarizing layer 22, and the barrier layer 23. For example, the surface treatment method includes a laser treatment, a chemical solution treatment, a plasma treatment, and the like.

In the case of forming the openings 25 by the laser treatment, it is preferable to use a $CO_2$ laser, an Ar laser, a YAG laser, or the like. In the case of using the chemical solution treatment, hydrofluoric acid, hydrochloric acid, or the like can be used to remove the barrier layer 23 made of an inorganic film. Nitric acid or the like can be used to remove the planarizing layer 22 and the resin layer 21. In order to supply the seal member 14 with a fine line width of about 1 mm in a later step, it is desirable to form the openings 25 in a fine pattern while bypassing the wirings. It is therefore preferable to use the laser treatment in which laser light is collected for scanning rather than to use the chemical treatment having an isotropic etching issue.

The step of forming an alignment film on the TFT substrate 11 and the counter substrate 12 is then performed. More specifically, after an alignment film material is applied by a flexographic printing method and baked, a rubbing process is performed in which the surface of the alignment film is rubbed in a fixed direction with a buff cloth. When the alignment film is formed, a cleaning process for removing foreign matters and for surface treatment is performed. It is therefore desirable to perform the step of forming the openings before the step of forming the alignment film.

In the step of forming the seal member, the seal member 14 such as a thermosetting resin or a photocurable resin is supplied to an approximately rectangular region including the openings 25 in the TFT substrate 11 or the counter substrate 12. The seal member 14 can be supplied by a common printing method, a screen printing method, or application by a dispenser. The openings 25 are filled with the seal member thus supplied to the surface of the TFT substrate 11 or the counter substrate 12 and the seal member is in direct contact with the fiber bodies 19 of the reinforcing layer 16.

Next, in the laminating step, the TFT substrate 11 and the counter substrate 12 are laminated to each other through the seal member 14, and the liquid crystal layer 13 is formed. In the case of forming the liquid crystal layer 13 by a dropping method, a liquid crystal material is dropped to the inside of the frame-shaped seal member 14 on the TFT substrate 11 or the counter substrate 12. Thereafter, the substrates 11, 12 are laminated to each other and the seal member 14 is cured. In the case where the seal member 14 is a thermosetting resin, the seal member 14 is cured by heating. In the case where the seal member 14 is a photocurable resin, the seal member 14 is cured by, for example, irradiation of light such as ultraviolet rays. The liquid crystal layer 13 may be formed by a common vacuum injection method. In the case of using the vacuum injection method, a liquid crystal inlet port is sealed by a sealing member. An opening may be formed in the region of the liquid crystal inlet port sealed by the sealing member so that the sealing member is bonded to the reinforcing layer 16. This can increase the adhesion strength between the sealing member and the reinforcing layer 16.

A backlight unit, an optical sheet and the like, which are not shown, are then disposed over the TFT substrate 11 and the counter substrate 12. The liquid crystal display device 1 is thus manufactured.

According to the first preferred embodiment, the seal member 14 is bonded directly to the reinforcing layer 16 of the TFT substrate 11 and the counter substrate 12. Therefore, the adhesion power between the seal member 14 and the TFT substrate 11 and the counter substrate 12 can be increased as well as film peeling of the substrates 11, 12 themselves can be prevented. As a result, the lamination strength between the TFT substrate 11 and the counter substrate 12 can be increased.

In other words, the TFT substrate 11 and the counter substrate 12 are formed as a plastic composite substrate that is flexible as a whole and have the reinforcing layer 16 including the fiber bodies 19 such as glass fibers. Therefore, the overall mechanical strength of the substrate 11, 12 can be improved. Moreover, since the seal member 14 is bonded in direct contact with the reinforcing layer 16 of the TFT substrate 11 and the counter substrate 12, the lamination strength between the TFT substrate 11 and the counter substrate 12 can be increased.

In general, a plastic substrate or the like is advantageous in terms of its flexibility. However, since the plastic substrate has a higher linear expansion coefficient than that of a glass substrate, it is difficult to accurately pattern TFTs and the like in a high temperature process. In the present preferred embodiment, a plastic composite substrate including the reinforcing layer 16 is used as the TFT substrate 11 and the counter substrate 12, and the reinforcing layer 16 is formed by the fiber bodies 19 such as glass fibers. The overall linear expansion coefficient of the substrate can therefore be reduced. As a result, the overall expansion deformation of the TFT substrate 11 and the counter substrate 12 can be prevented even in a high temperature process, whereby TFTs, a color filter, and the like can be accurately patterned, enabling accurate alignment of the pixel electrodes of the TFT substrate 11 with the color filter of the counter substrate 12.

The substrates 11, 12 have a low linear expansion coefficient and the difference in linear expansion coefficient is small between the substrates 11, 12. Therefore, even if heating for curing the seal member 14 is performed after the TFT substrate 11 and the counter substrate 12 are laminated to each other or even if the liquid crystal display device is used in a high temperature environment, seal peeling and film peeling due to the difference in expansion deformation amount between the TFT substrate 11 and the counter substrate 12 can be prevented.

Preferably, the TFT substrate 11 and the counter substrate 12 including the reinforcing layer 16 have the layered structure 18 of a plurality of layers as described above. In this case, however, the adhesion power between the layers (the reinforcing layer 16, the resin layer 21, the planarizing layer 22, and the barrier layer 23) is different at each interface. Film peeling is therefore likely to occur at the interface having the weakest adhesion power in the whole layered structure 18. In other words, the overall seal adhesion strength in a display panel having the TFT substrate 11 and the counter substrate 12 is determined by the interface having the weakest adhesion strength in each layered structure 18.

In the present preferred embodiment, a plurality of groove-like openings 25 are formed by partially removing a plurality of layers (the resin layer 21, the planarizing layer 22, and the barrier layer 23), and the seal member 14 is bonded in direct contact with the reinforcing layer 16 exposed by the openings 25. This structure increases the contact area between the seal member 14 and the reinforcing layer 16 made of the fiber bodies 19, whereby the adhesion power between the seal member 14 and the TFT substrate 11 and the counter substrate 12 can be increased.

Moreover, since a layered portion (the resin layer 21, the planarizing layer 22, and the barrier layer 23) which causes film peeling is removed in the formation region of the openings 25, film peeling can be prevented in this region. Moreover, since the seal member 14 can be strongly bonded to the substrates 11, 12 (the reinforcing layer 16) in the openings 25, the adhesion power between the TFT substrate 11 and the counter substrate 12 can be increased also in the region around the openings 25. Film peeling can therefore be prevented.

Moreover, since the openings 25 are arranged in a staggered or mosaic pattern, wirings can be easily extended from the display region in the middle of the TFT substrate 11 and the counter substrate 12 to the frame region through the gaps between the openings 25.

Second Preferred Embodiment

Figure 6:
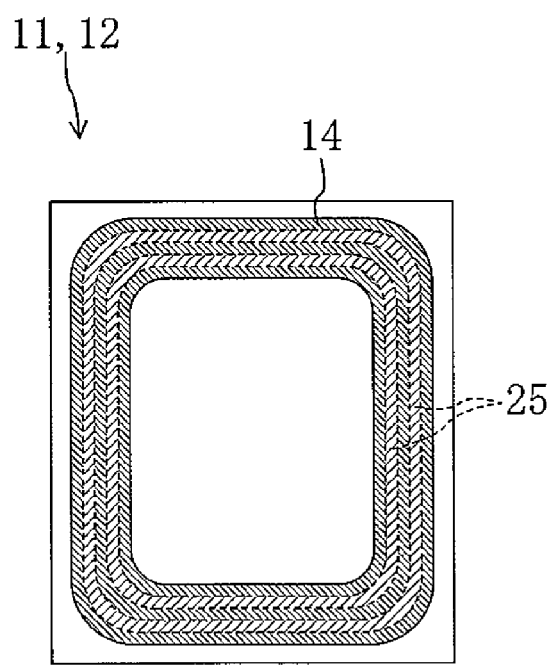
FIG. 6 is a plan view schematically showing a seal member and openings that are formed in a substrate of a second preferred embodiment of the present invention.

FIG. 6 is a plan view schematically showing a TFT substrate 11 and a counter substrate 12 according to a second preferred embodiment of the present invention. Note that in the following preferred embodiments, the same elements as those shown in FIGS. 1 through 5 are denoted by the same reference numerals and detailed description thereof will be omitted. Although the openings 25 are arranged in a staggered pattern in the first embodiment, openings 25 of the second preferred embodiment are preferably formed in a ring shape so as to extend along a circumferential direction of a seal member 14.

As in the first preferred embodiment, the seal member 14 has an approximately rectangular frame shape when viewed from a normal direction to the TFT substrate 11 or the counter substrate 12. The openings 25 therefore preferably have an approximately rectangular ring shape. A plurality of ring-shaped openings 25 are arranged coaxially. For example, two stripe-shaped openings are doubly arranged in the second preferred embodiment. However, three or more openings 25 may be arranged triply or more, or one opening 25 may be arranged singly.

With this structure, the same effects as those of the first preferred embodiment can be obtained. Moreover, the area of the openings 25 can be effectively increased and the adhesion power between the TFT substrate 11 and the counter substrate 12 can be increased. However, in the case where wirings or the like are extended from the display region inside the seal member 16 to the frame region outside the seal member 16, it is preferable to arrange the openings 25 in a staggered pattern to provide a predetermined gap between the openings 25 as in the first preferred embodiment.

Third Preferred Embodiment

Figure 7:
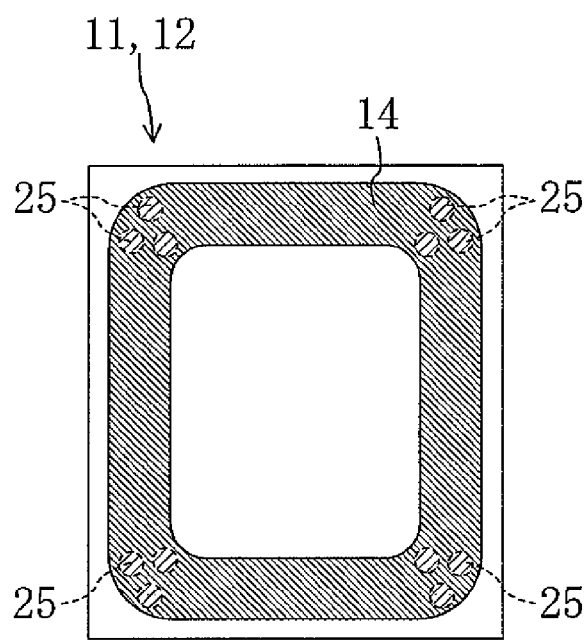
FIG. 7 is a plan view schematically showing a seal member and openings that are formed in a substrate of a third preferred embodiment of the present invention.
Figure 8:
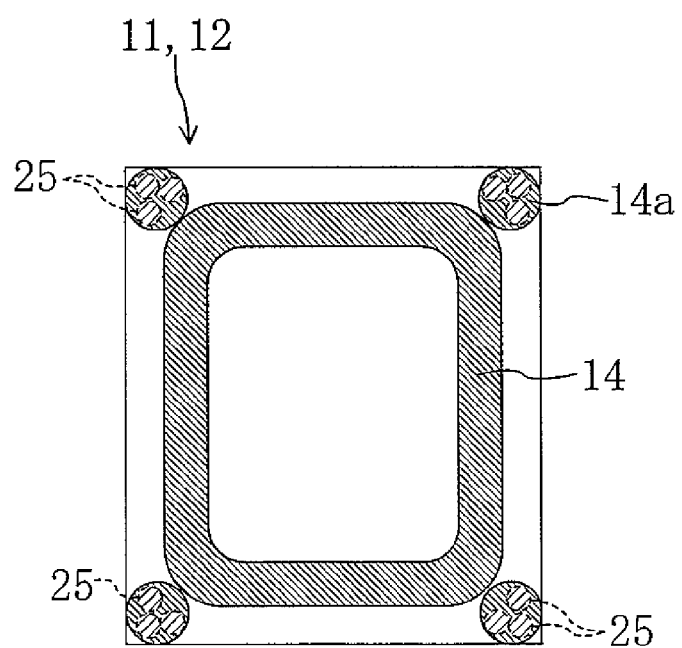
FIG. 8 is a plan view schematically showing a seal member and openings in another example of the third preferred embodiment of the present invention.

FIGS. 7 and 8 are plan views schematically showing a TFT substrate 11 and a counter substrate 12 according to a third preferred embodiment of the present invention.

The openings 25 are arranged in a staggered pattern in the first preferred embodiment. In the third preferred embodiment, however, openings 25 are formed in four corner regions of a seal member 14 having an approximately rectangular frame shape when viewed from a normal direction to the TFT substrate 11 or the counter substrate 12. As shown in FIG. 7, each opening 25 has, for example, a circular shape when viewed from the normal direction to the TFT substrate 11 or the counter substrate 12, and three openings 25, for example, are formed in each of the four corner regions.

Since the four corner regions of the seal member 14 are likely to be subjected to an external force during a manufacturing process or the like, it is desirable to increase the bonding power between the substrates 11 and 12. In the third preferred embodiment, the openings 25 are provided in the four corner regions that are likely to be subjected to the external force. Therefore, the adhesion power between the seal member 14 and the TFT substrate 11 or the counter substrate 12 is increased in the four corner regions, whereby the bonding power between the substrates 11 and 12 can be increased.

As shown in FIG. 8, openings 25 may alternatively be formed in corner regions of the TFT substrate 11 or the counter substrate 12 other than the formation region of the seal member 14 for protecting the display region.

In the case where the openings 25 are formed in the formation region of the seal member 14, it is required to increase the line width of the entire seal member 14 or to make the line width of the seal member 14 wider in the formation region of the openings 25 than in the other region. This may increase the supply amount of the seal member 14 or may make it difficult to control the supply amount of the seal member 14 and adjust the line width of the seal member 14.

In the structure of FIG. 8, the seal member 14 for protecting the display region and a seal member 14a for increasing the adhesion power in the openings 25 formed in the corner regions are provided separately. Since the seal member 14a can be supplied separately and independently from the seal member 14, increase in supply amount of the seal member 14 can be prevented and the supply amount of the seal member 14 can be easily controlled. As a result, the bonding power between the substrates 11 and 12 can be increased by the seal member 14a of the openings 25, while the display region can be sufficiently protected by the seal member 14. In other words, by providing the two seal members 14, 14a, variation in line width of the seal member 14 due to the uneven distribution of the openings 25 can be prevented, and entry of foreign matters such as moisture into the display region can be prevented while increasing the lamination strength.

Fourth Preferred Embodiment

Figure 9:
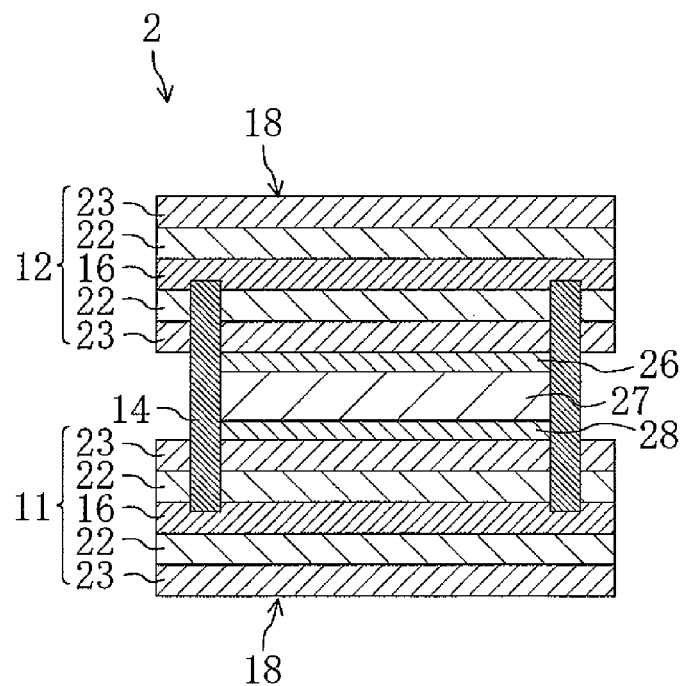
FIG. 9 is a cross-sectional view schematically showing a structure of an organic EL display device of a fourth preferred embodiment of the present invention.

FIG. 9 is a cross-sectional view showing a schematic structure of an organic EL display device 2 according to a fourth preferred embodiment of the present invention.

In the first preferred embodiment, the liquid crystal display device 1 was described as an example of the display device. The organic EL display device 2 will be described as another example of the display device in the fourth preferred embodiment.

A TFT substrate 11 and a counter substrate 12 preferably have the same structure as that of the first preferred embodiment. A cathode layer 28 is formed on the surface on the counter substrate 12 side of the TFT substrate 11. An anode layer 26 is formed on the surface on the TFT substrate 11 side of the counter substrate 12. An organic light-emitting layer 27 is provided as a display medium layer between the cathode layer 28 and the anode layer 26. The cathode layer 28 and the anode layer 26 can be formed as a transparent electrode by, for example, ITO. The organic light-emitting layer 27 can be formed by a vacuum deposition method.

With this structure, the organic light-emitting layer 27 is caused to emit light, whereby display is provided. The present invention is thus applicable to other display devices such as an organic EL display device and is capable of preventing permeation of foreign matters such as moisture. A stable organic EL display device having a high adhesion strength of the seal member 14 can thus be provided.

Fifth Preferred Embodiment

Figure 10:
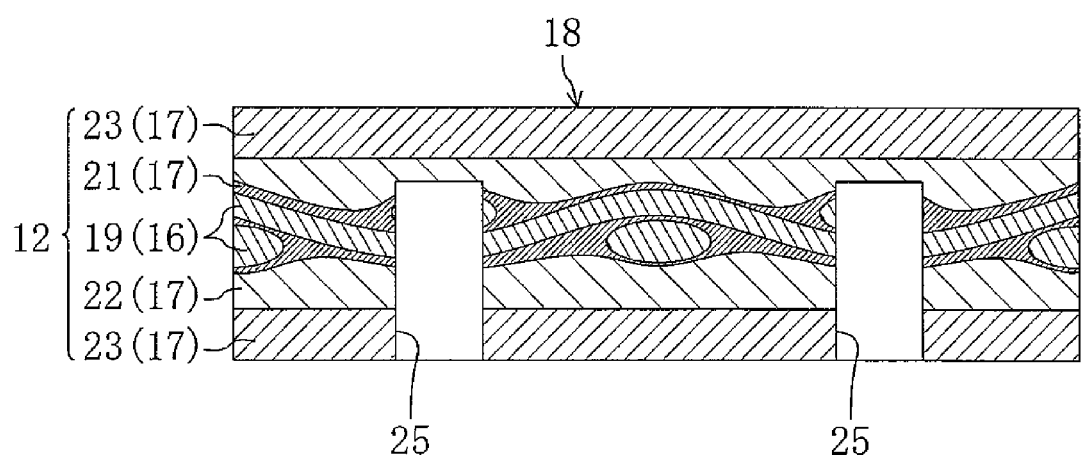
FIG. 10 is an enlarged cross-sectional view of a TFT substrate or a counter substrate of a fifth preferred embodiment of the present invention.

FIG. 10 is a cross-sectional view of a TFT substrate 11 or a counter substrate 12 according to a fifth preferred embodiment of the present invention.

In the first preferred embodiment, the reinforcing layer 16 is exposed at the bottom of the openings 25. In the fifth preferred embodiment, on the other hand, a reinforcing layer 16 is exposed to the inner peripheral surface of openings 25. In other words, the openings 25 are formed so as to extend through the reinforcing layer 16. A planarizing layer 22 is exposed at the bottom of the openings 25. Note that a barrier layer 23 may be exposed at the bottom of the openings 25. By filling the openings 25 with a seal member 14, the seal member 14 and the reinforcing layer 16 can be directly bonded to each other in a portion of the inner peripheral surface of the openings 25.

Since the seal member 14 and the reinforcing member 16 can be directly bonded to each other in the fifth preferred embodiment, the same effects as those of the first preferred embodiment can be obtained. Moreover, this structure increases the adhesion area between the seal member 14 and the TFT substrate 11 and the counter substrate 12 in the inner peripheral surface of the openings 25 extending through the TFT substrate 11 and the counter substrate 12, whereby the adhesion strength can further be improved and film peeling can be prevented.

Other Preferred Embodiments

An example in which both the TFT substrate 11 and the counter substrate 12 have the layered structure 18 including the reinforcing layer 16 has been described in each of the above preferred embodiments. However, the present invention is not limited to this, and at least one of the TFT substrate 11 and the counter substrate 12 need only have the layered structure 18. The substrate that does not have the layered structure 18 can be, for example, a common glass substrate or a plastic substrate. For example, the reinforcing layer 16 may be provided in the outermost layer of the layered structure 18.

A transparent liquid crystal display device was described in the first, second, third, and fifth preferred embodiments. However, the present invention is not limited to this, and the present invention is also applicable to, for example, a reflective or transflective liquid crystal display device.

In the case where the present invention is applied to, for example, a reflective liquid crystal display device, an opaque substrate can be used as the TFT substrate. An opaque carbon fiber or the like can therefore be used as the fiber bodies included in the reinforcing layer 16.

FIRST EXAMPLE

Hereinafter, a first non-limiting example in which a preferred embodiment of the present invention was embodied will be described.

Composite substrates having a reinforcing layer 16 made of a collection of glass fiber bodies (glass fiber diameter of about 20 μm) are prepared as substrates 11, 12. The reinforcing layer 16 and a resin layer 21 have a two-layer structure with each layer having a thickness of 80 μm, and the total thickness is 160 μm. Each of a planarizing layer 22 and a barrier layer 23 has a thickness of 10 to 20 μm. Each substrate 11, 12 has a 127 mm by 127 mm square shape as a whole and has a thickness of 0.17 mm.

A plurality of openings 25 are formed in the substrates 11, 12 by a $CO_2$ laser. The openings 25 are arranged in a staggered pattern as described in the first preferred embodiment (see FIG. 3). The width (length in a width direction of a seal member 14) of the openings 25 is 200 μm and the depth thereof is 10 to 30 μm. The seal member 14 is formed in one substrate 11 and the substrate 11 is laminated to the other substrate 12. Structbond XN-21S (made by Mitsui Chemicals, Inc.) is used as the seal member 14 and the line width of the seal member 14 is 1.5 to 2.0 mm. The seal member 14 was cured by heating at 180° C. for two hours.

The adhesion strength of the test substrates of the first example thus fabricated was measured and the result was 1.1 $N/mm^2$. In the case where no opening 25 was formed, the measured adhesion strength was 0.3 $N/mm^2$. This result shows that the adhesion strength becomes about 3.7 times larger by providing the openings 25.

SECOND EXAMPLE

A second example will now be described. The same substrates 11, 12 as those of the first example are prepared and ring-shaped openings 25 are formed as in the second preferred embodiment (see FIG. 6). The width and depth of the openings 25 in the second example are the same as those of the first example. The structure of the second example is the same as that of the first example except for the openings 25. The adhesion strength of the test substrates of the second example thus fabricated was measured and the result was 1.1 $N/mm^2$, which is the same as the first example.

As has been described above, various preferred embodiments of the present invention are useful for a display device having a substrate formed by a plurality of layers including a reinforcing layer, and a manufacturing method thereof. Preferred embodiments of the present invention are particularly suitable to increase the adhesion power between a substrate and a seal member and to suppress film peeling of the substrate itself.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A display device comprising:
a first substrate;
a second substrate arranged to face the first substrate; and
a seal member arranged to bond the first substrate and the second substrate to each other with a display medium layer enclosed between the first substrate and the second substrate; wherein
at least one of the first substrate and the second substrate has a layered structure of a reinforcing layer and one or more layers having a lower strength than that of the reinforcing layer, an opening is formed in the one or more layers so as to expose a portion of the reinforcing layer, and at least a portion of the seal member is bonded directly to the reinforcing layer in the opening.

2. The display device according to claim 1, wherein the seal member has an approximately frame shape when viewed from a normal direction to the first substrate or the second substrate, and the opening has a ring shape extending along a circumferential direction of the seal member.

3. The display device according to claim 2, wherein a plurality of ring-shaped openings are coaxially arranged.

4. The display device according to claim 1, wherein the seal member has an approximately frame shape when viewed from a normal direction to the first substrate or the second substrate, and the opening has a staggered pattern when viewed from the normal direction to the first substrate or the second substrate.

5. The display device according to claim 1, wherein the seal member has an approximately rectangular frame shape when viewed from a normal direction to the first substrate or the second substrate, and the opening is formed in four corner regions of the seal member when viewed from the normal direction to the first substrate or the second substrate.

6. The display device according to claim 1, wherein the opening extends through the reinforcing layer.

7. The display device according to claim 1, wherein, of the first substrate and the second substrate, a substrate having the reinforcing layer is a flexible substrate.

8. The display device according to claim 1, wherein the reinforcing layer is a layer made of a plurality of fiber bodies.

9. The display device according to claim 8, wherein the fiber bodies are made of glass fibers.

10. The display device according to claim 8, wherein the fiber bodies are made of aromatic polyamide resin fibers.

11. The display device according to claim 1, wherein each of the first substrate and the second substrate has the reinforcing layer.

12. The display device according to claim 1, wherein the reinforcing layer has a smaller linear thermal expansion coefficient than that of the one or more layers.

13. The display device according to claim 1, wherein the display medium layer is a liquid crystal layer.

* * * * *